United States Patent
Zeidman et al.

(10) Patent No.: US 7,620,928 B2
(45) Date of Patent: Nov. 17, 2009

(54) METHOD AND APPARATUS FOR SYNTHESIZING A HARDWARE SYSTEM FROM A SOFTWARE DESCRIPTION

(75) Inventors: Robert Marc Zeidman, Cupertino, CA (US); Michael Barr, Elkridge, MD (US); Daniel R. Hafeman, Sunnyvale, CA (US)

(73) Assignee: Robert Zeidman, Cupertino, CA (US)

( * ) Notice: Subject to any disclaimer, the term of this patent is extended or adjusted under 35 U.S.C. 154(b) by 173 days.

(21) Appl. No.: 11/683,672

(22) Filed: Mar. 8, 2007

(65) Prior Publication Data
US 2007/0198512 A1    Aug. 23, 2007

Related U.S. Application Data

(63) Continuation of application No. 10/604,156, filed on Jun. 27, 2003, now Pat. No. 7,210,116.

(51) Int. Cl.
G06F 17/50  (2006.01)
G06F 17/30  (2006.01)
G06F 9/44  (2006.01)
G06F 9/45  (2006.01)

(52) U.S. Cl. .................. 716/18; 716/1; 707/6; 717/124; 717/126; 717/151; 717/159

(58) Field of Classification Search ............... 716/1, 716/18; 707/6; 717/124, 126, 151, 159
See application file for complete search history.

(56) References Cited

U.S. PATENT DOCUMENTS

| | | | | |
|---|---|---|---|---|
| 5,651,111 A | * | 7/1997 | McKeeman et al. ........... 714/38 |
| 5,787,450 A | * | 7/1998 | Diedrich et al. ............. 715/205 |
| 5,862,361 A | * | 1/1999 | Jain ............................ 703/16 |
| 7,284,210 B2 | * | 10/2007 | Baumgartner et al. .......... 716/3 |
| 2002/0183997 A1 | * | 12/2002 | Powell et al. ................. 703/13 |
| 2003/0084063 A1 | * | 5/2003 | DelMonaco et al. ..... 707/103 R |
| 2003/0110477 A1 | * | 6/2003 | Wakabayashi et al. ....... 717/135 |
| 2004/0010777 A1 | * | 1/2004 | Klein ........................ 717/127 |
| 2004/0064798 A1 | * | 4/2004 | Alpert et al. .................... 716/6 |
| 2004/0237062 A1 | * | 11/2004 | Zeidman et al. ............. 717/100 |
| 2005/0010378 A1 | * | 1/2005 | Zeidman et al. ................. 703/1 |
| 2005/0149921 A1 | * | 7/2005 | Rollins ....................... 717/168 |
| 2006/0130023 A1 | * | 6/2006 | Klein ......................... 717/140 |
| 2006/0190907 A1 | * | 8/2006 | Allen et al. ................... 716/18 |
| 2008/0155497 A1 | * | 6/2008 | Chupa et al. ................ 717/106 |
| 2008/0263525 A1 | * | 10/2008 | Berg et al. ................... 717/131 |

* cited by examiner

Primary Examiner—Stacy A Whitmore
(74) Attorney, Agent, or Firm—Jim H. Salter

(57) ABSTRACT

A method and an apparatus take software source code to synthesize a hardware platform for running the software. The method determines which processor is suitable for running the code and meeting the performance parameters determined by the user. The method also determines which hardware devices are accessed by software. If the hardware target is a semiconductor chip, the invention selects the appropriate IP and creates an HDL description of the chip. If the hardware target is a printed circuit board, the invention creates a schematic or netlist that includes the appropriate microprocessor, the various semiconductor chips, and the necessary interconnections.

10 Claims, 6 Drawing Sheets

| Processor | Memory space | Address bus | Data bus | Internal registers | Internal cache | Task switch time | Cost | Languages | Clock speed | Architecture |
|---|---|---|---|---|---|---|---|---|---|---|
| MIPS32 M4K | 4 Gbytes | 32 bits | 32 bits | 24 | 16 Mbytes | 2 μsecs | $54.00 | C, C++, Java, asm | 500 MHz | RISC |
| ARM7TDMI | 4 Gbytes | 32 bits | 32 bits | 16 | 16 Mbytes | 3 μsecs | $22.00 | C, C++, Java, asm | 300 MHz | RISC |
| PowerPC 405 | 4 Gbytes | 32 bits | 32 bits | 16 | 32 Mbytes | 4 μsecs | $65.00 | C, C++, Java, asm | 300 MHz | RISC |
| 68HC11 | 64 Kbytes | 16 bits | 8 bits | 4 | 0 Mbytes | 1 μsecs | $1.00 | asm | 10 MHz | CISC |
| 8051 | 64 Kbytes | 16 bits | 32 bits | 4 | 0 Mbytes | 1 μsecs | $0.50 | C, asm | 10 MHz | CISC |

Figure 3

```
/*** This is the normal header comments for the routine    ****/
/***                  .                                    ****/
/***                  .                                    ****/
/***                  .                                    ****/
/*** The following information is required for the present
invention    ****/
/*** Driver information:
        Name: Ethernet driver
        Version: 1.01
        Hardware: ETH101
        Other:
                                                           ****/

EtherDriver(in1, in2, in3, out);
{
        // body of code
}
```

METHOD AND APPARATUS FOR SYNTHESIZING A HARDWARE SYSTEM FROM A SOFTWARE DESCRIPTION

CROSS REFERENCE TO RELATED APPLICATIONS

The present invention is a continuation of U.S. patent application Ser. No. 10/604,156, filed Jun. 27, 2003 now U.S. Pat. No. 7,210,116, incorporated herein by reference.

BACKGROUND OF THE INVENTION

The present invention is a tool for developing embedded systems hardware. When hardware and software are developed for an embedded system, typically the hardware is specified and designed, and then the software is written to control the hardware. In some cases, the hardware and software are specified and designed in parallel, with trade-offs occurring as needed during the process. However, the software that runs the system can be considered a specification for the system itself. For example, if the software includes a driver for a UART, a UART must be designed into the hardware. If the software has a timer interrupt task, the hardware must provide a timer. If the software application needs to transmit and receive Ethernet data, the hardware must provide an Ethernet interface. Ideally, the software functionality would be determined first and the hardware would be designed to accommodate the software.

SUMMARY OF THE INVENTION

The present invention relates to a method and an apparatus that uses software to synthesize a hardware platform for running the software. The invention determines which processor is suitable for running the code and meeting the performance parameters determined by the user. The invention also determines which hardware devices are accessed by software. If the hardware target is a semiconductor chip, the invention selects the appropriate hardware description (IP) for the processor and selects IP for the other devices on the chip using a library of IP or input from the user. If the hardware target is a printed circuit board, the invention creates a schematic or netlist that includes the appropriate microprocessor and the various semiconductor chips and the necessary interconnections.

One aspect of the present invention provides that the software can be written independently of the processor. The user can then input various parameters relating to performance, die size, cost, and other factors. The invention uses these inputs to determine the best hardware platform for the software, including which devices and which processors will best meet the requirements.

Further features and advantages of various embodiments of the present invention are described in the detailed description below, which is given by way of example only.

BRIEF DESCRIPTION OF THE DRAWINGS

The present invention will be understood more fully from the detailed description given below and from the accompanying drawings of the preferred embodiment of the invention, which, however, should not be taken to limit the invention to the specific embodiment but are for explanation and understanding only.

FIG. 3 shows a list of processors and corresponding attributes of the processors.

FIG. 5 shows an example of standard driver routine source code with a header that allows the present invention to identify the source code.

DETAILED DESCRIPTION

The present invention will be understood more fully from the detailed description given below and from the accompanying drawings of the preferred embodiment of the invention, which, however, should not be taken to limit the invention to the specific embodiment but are for explanation and understanding only.

Figure 1:
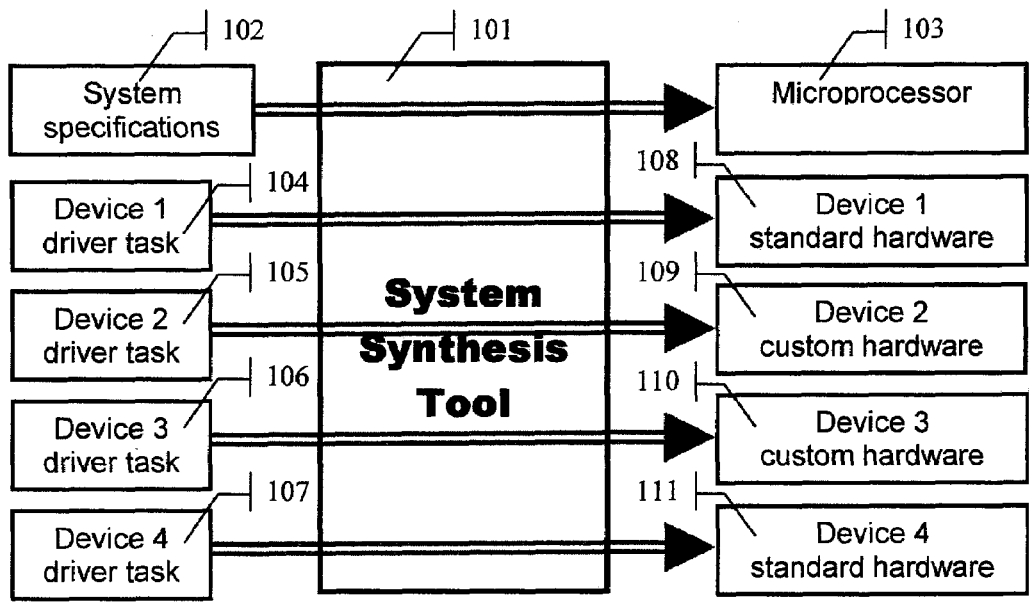
FIG. 1 shows a high-level diagram of system synthesis using the present invention.

As shown in FIG. 1 and according to one embodiment of the present invention, the system synthesis tool 101 takes as input the system specifications 102, including timing requirements, language support requirements, and other requirements, to determine an appropriate microprocessor 103 for the system hardware. In addition, each device driver task 104, 105, 106, and 107 in the system determines which devices 108, 109, 110, and 111 are to be implemented in hardware. If a platform system on a chip (SOC) is used, like the RapidChip from LSI Logic Corporation or the Excalibur FPGA from Altera Corporation, the processor and the standard hardware devices are implemented using a library of IP cores. Each non-standard device needs to be implemented by the developer using a hardware description language (HDL) such as Verilog or VHDL. The processor and the devices are determined by the system synthesis tool 101, which produces a chip description. The developer inputs this resulting chip description into a hardware synthesis program from a third party that synthesizes a lower level hardware description that can be placed and routed on a platform SOC.

Similarly, the system synthesis tool 101 can target a printed circuit board. The processor 103 is an off-the-shelf chip chosen by the system requirements 102 as shown in FIG. 1. The standard hardware devices 108 and 111 are LSI and VLSI chips chosen from a library of standard ICs. The custom hardware devices 109 and 110 are implemented in CPLDs or FPGAs, requiring the designer to create the desired functionality using an HDL like Verilog or VHDL. The resulting netlist created by the system synthesis tool 101 is input to a layout program from a third party that can produce a layout for a printed circuit board (PCB).

Figure 2:
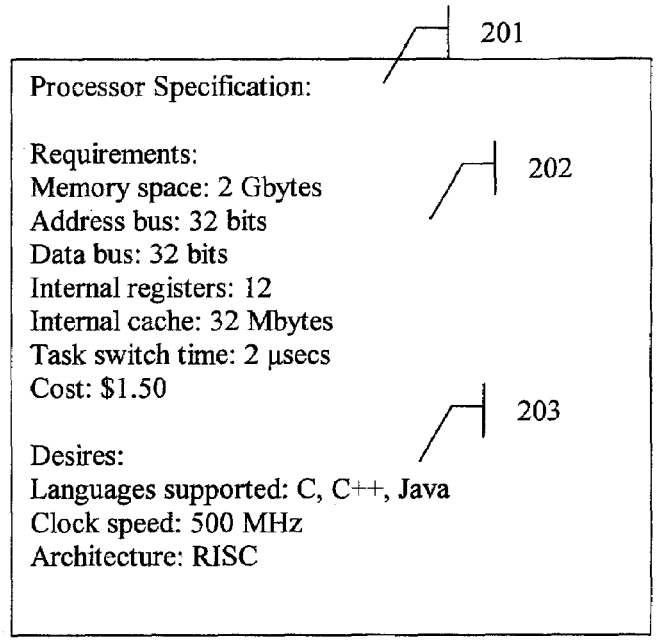
FIG. 2 shows a description of a processor that meets the requirements for a system being developed.

FIG. 2 shows an exemplary processor specification file 201 that contains a description of the requirements 202 and desires 203 of the processor determined for the system. These requirements can be determined by hand or by a system analysis performed by a software tool. The processor specification file 201 may be divided into two groups, requirements 202 and desires 203. Requirements 202 are features necessary for the design and may include, but are not limited to, the amount of memory space that the processor can address, the size of the address bus, the size of the data bus, the number of internal registers, the size of the internal cache, the time required to switch between tasks, and the cost of the device. Desires 203 are features that would further optimize the system but are not necessary to meet the system specifications. Desires 203 may include, but are not limited to, the language compilers that are available for the processor, the clock speed of the processor, and the internal architecture of the device.

FIG. 3 shows an exemplary processor attribute table 300 of processors and corresponding attributes of the processors. The system synthesis tool 101 maintains this table in a format that can be searched easily. The format may be a simple comma delimited text file, a Microsoft Excel file, or other format. The table contains a list of processors as shown in column 301. For each processor, there are associated attributes such as, but not limited to, memory space 302, address bus size 303, data bus size 204, the number of internal registers 305, the size of the internal cache 306, the task switch time 307, the cost 308, the language compilers supported for the given processor 309, the clock speed 310, and the architecture type 311.

Figure 4:
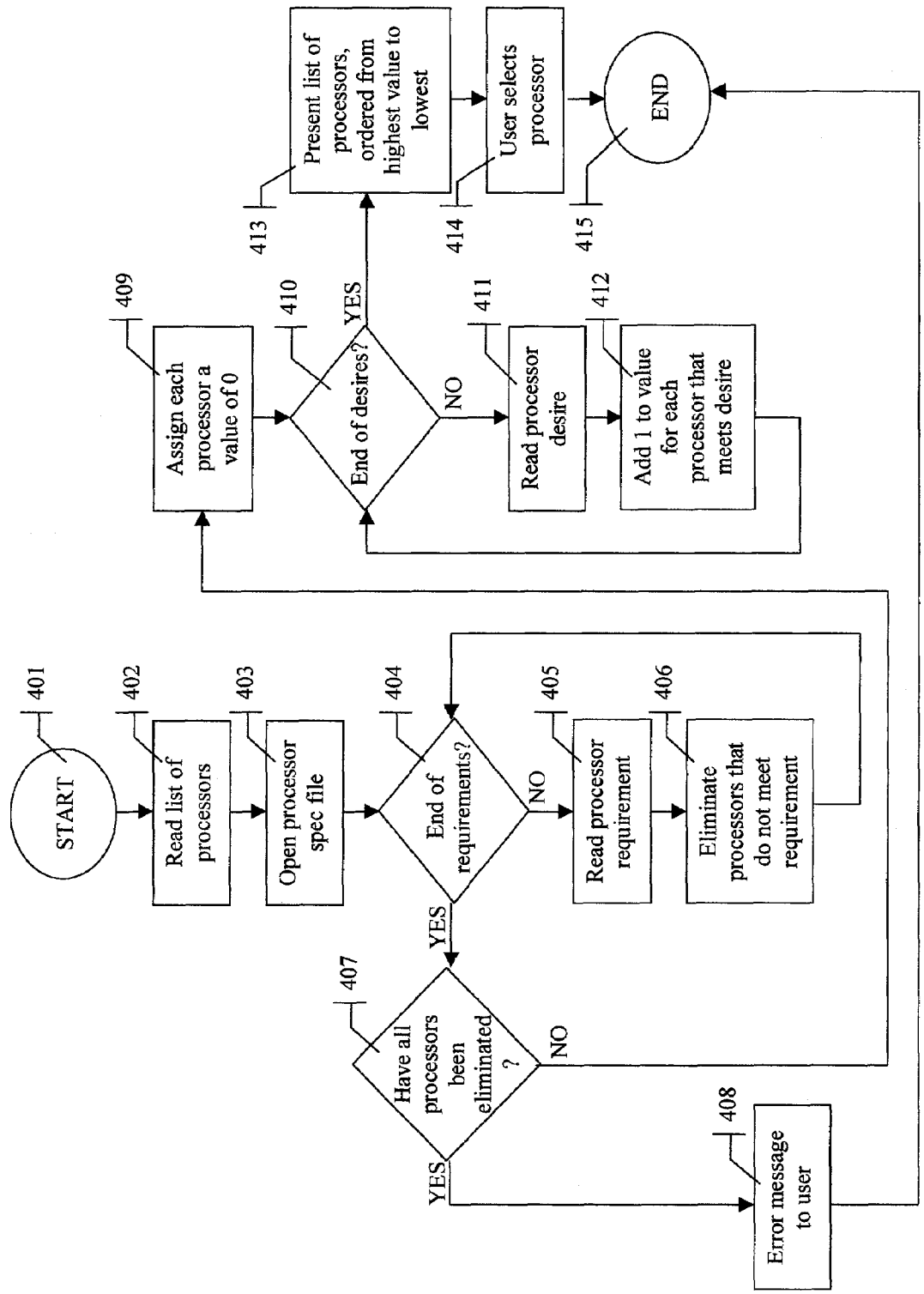
FIG. 4 shows a flow chart of the process used by the present invention to read the processor requirements and choose the appropriate processor.

The processor specification file (201 in FIG. 2) is examined by the system synthesis tool 101 as illustrated in FIG. 4. The system synthesis tool 101 begins in block 401 and proceeds to block 402 where it reads a list of processors and their properties from a processor attribute table (300 in FIG. 3). This table may have been supplied with the system synthesis tool 101, it may be supplied by the user, or it may be a combination of tables supplied by both. This table is typically updated regularly to include new processors or existing processors that have become supported by the system synthesis tool 101. The system synthesis tool 101 proceeds to block 403 where it opens the processor specification file described in FIG. 2. The system synthesis tool 101 proceeds to block 404 and determines whether the end of the list of requirements specified in the processor specification file has been reached. If the end of the list of requirements has not been reached, the system synthesis tool 101 proceeds to block 405 and reads the next processor requirement for the current project from the processor specification file. The system synthesis tool 101 proceeds to block 406 where it goes through the list of processors in the processor attribute table and eliminates all processors that do not meet said processor requirement. The system synthesis tool 101 proceeds to block 404 where it again determines whether it has reached the end of the list of requirements. If the end has not been reached, the system synthesis tool 101 continues to block 405 and reads the next requirement.

If the end of the list of requirements has been reached in block 404, the system synthesis tool 101 proceeds to block 407. If all processors in the processor attribute table have been eliminated, the system synthesis tool 101 proceeds to block 408 and issues an error message to the user, who can then decide how to reduce or change the requirements so that a processor can be found. The system synthesis tool 101 proceeds to block 415 and ends.

In block 407, if one or more processors remain in the processor attribute table that meet the project requirements, the system synthesis tool 101 proceeds to block 409 where it assigns each remaining processor in the processor attribute table a value of 0. The system synthesis tool 101 proceeds to block 410 where it determines whether the end of the list of desires in the processor specification file has been reached. If the end has not been reached, the system synthesis tool 101 proceeds to block 411 where it reads the processor desire from the processor specification file. The system synthesis tool 101 proceeds to block 412 where it adds 1 to the value of each processor in the processor attribute table that meets said processor desire. The system synthesis tool 101 returns to block 410 where it determines whether the end of the list of desires in the processor specification file has been reached.

If the end of the list of desires in the processor specification file has been reached in block 410, the system synthesis tool 101 proceeds to block 413 where it presents to the user a list of all processors that meet the requirements (i.e. have not been eliminated from the processor attribute table), ranked according to the assigned values, highest to lowest, that determine which processor best meets the desires. Note that in another embodiment, desires may have different levels of importance associated with them. In this embodiment, the desires listed in the processor specification file would have associated values and, instead of simply adding a 1 in block 412, these values would be added to the value of the processor that meets these desires.

The system synthesis tool 101 proceeds to block 414 where the user selects a processor for the project. The system synthesis tool 101 proceeds to block 415 and ends the search for a processor.

In addition to assisting the user in selecting the appropriate processor, the system synthesis tool 101 examines the source code files and finds each software driver routine in order to determine the corresponding hardware device. In one embodiment, this process of finding driver routines is accomplished by searching for a specific header to the routine that describes the task. An example of a driver routine source code with such a specific header is shown in FIG. 5. In this example, the driver source code 500 contains three sections. The first section 501 is the normal header for the routine containing comments that describe such things as the date the routine was created, the date it was modified, the author of the code, and a brief description of the functionality of the code. The second section 502 is the header needed for the system synthesis tool 101. This section 502 contains specific information that the system synthesis tool 101 uses to determine which device this driver source code controls. This section 502 may contain information about the hardware that the driver is controlling, the revision number of the driver, and other information that the compiler assist component can use. Note that in this example the driver header section 502 refers to ETH101, which is a standard device that the system synthesis tool 101 can reference from a library of standard devices. The third section 503 is the driver source code that performs the necessary functions to control the hardware when the source code is compiled and executed.

Figure 6:
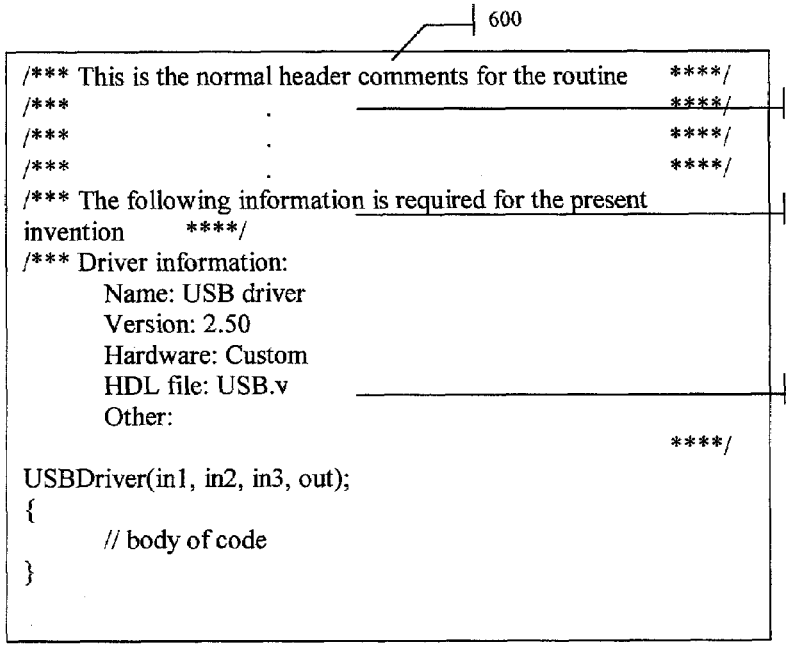
FIG. 6 shows an example of custom driver routine source code with a header to allow the present invention to identify the source code.

In addition to assisting the user in selecting the appropriate processor and determining standard hardware devices, the system synthesis tool 101 examines the source code files and finds each custom software driver routine in order to determine the corresponding custom hardware device. A custom hardware device is one that has been designed specifically by the user and is not widely available to other users. An example of such a custom driver routine source code is shown in FIG. 6. Like the standard driver source code, the custom driver source code 600 may contain three sections. The first section 601 is the normal header for the routine containing comments that describe such things as the date the routine was created, the date it was modified, the author of the code, and a brief description of the functionality of the code. The second section 602 is the header needed for the system synthesis tool 101. This section 602 contains specific information that the system synthesis tool 101 uses to determine which hardware language routines this driver source code controls. This section 602 may contain information about the hardware that the driver is controlling, the revision number of the driver, and other information that the compiler assist component can use. Note that the driver header section 602 refers to custom hardware. Also note that in this example, section 602 refers to an HDL file called USB.v, which contains the Verilog code for a non-standard USB device. The third section 603 is the driver source code that performs the necessary functions to control the hardware when the source code is compiled and executed.

In an alternate embodiment, a list of standard software driver source code routines and corresponding hardware devices is maintained by the system synthesis tool 101. The system synthesis tool 101 searches the user's source code routines looking for matches with the standard software driver source code routines in the list. When a match is found, the system synthesis tool 101 determines the corresponding standard hardware device from the list.

Also in this alternate embodiment, the system synthesis tool 101 finds the custom hardware devices required by the source code by searching a list containing descriptions of custom software driver source code and corresponding custom devices. This list must be maintained by the user, because custom devices are designed specifically by the user. The system synthesis tool 101 searches the user's source code routines looking for matches with the custom software driver source code routines in the list. When a match is found, the system synthesis tool 101 determines the corresponding custom hardware device from the list.

Figure 7:
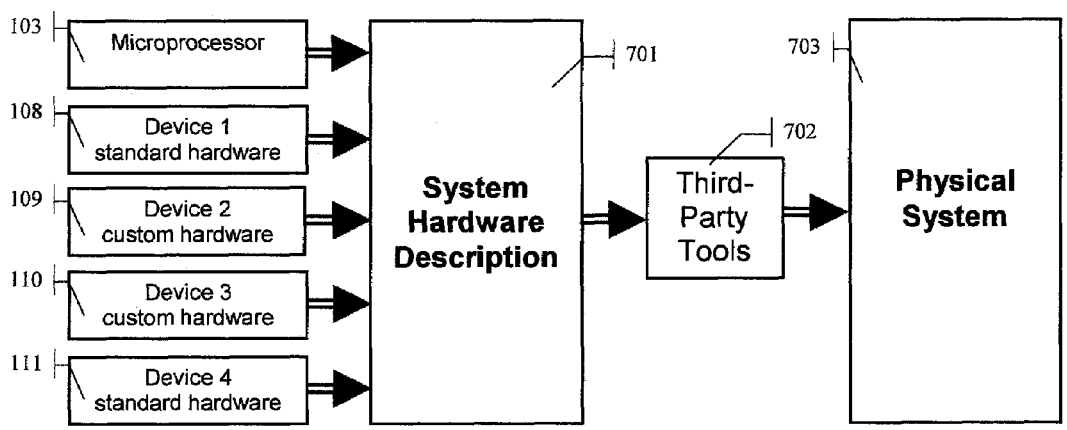
FIG. 7 shows how a processor and device descriptions generated by the present invention from processor specifications and software driver routines respectively are combined into a system hardware description that is then run through third-party tools to create a physical system for running software.

FIG. 7 illustrates how the system synthesis tool 101 creates a physical system. The system synthesis tool 101 takes the microprocessor description 103 and combines it with standard hardware device descriptions 108 and 111 and with custom hardware device descriptions 109 and 110 to create a single system hardware description 701. In one embodiment, the processor and device descriptions are hardware description language (HDL) descriptions and the resulting system hardware description is also HDL description. In this embodiment, the system synthesis tool 101 uses standard, well-known techniques including combining standard module interfaces and buses, small amounts of glue logic, and I/O buffers to connect the devices into a single hardware system description 701. In a second embodiment, the processor and device descriptions are combinations of HDL descriptions and hard IP cores representing physical layouts on a chip. In this second embodiment, the system synthesis tool 101 uses a well-known technique that uses HDL wrapper modules for the hard IP cores. All HDL modules, including wrapper modules, are then combined by the system synthesis tool 101 using the conventional techniques described previously to create a single system hardware description 701. In a third embodiment, the processor description and device descriptions are schematic symbols for standard semiconductor ICs. The custom devices are represented by programmable devices such as complex programmable logic devices (CPLDs) and field programmable gate arrays (FPGAs). In this third embodiment, the system synthesis tool 101 combines these symbols into a single schematic of the entire system hardware 701 using standard, well-known techniques such as buses and glue logic.

The user takes the system hardware description 701 and uses third-party software tools 702 to produce a physical system 703. In the first and second embodiment described above, the software tools 702 consists of conventional logic synthesis tools, layout tools, and fabrication tools that take the HDL hardware system description 701 and produce a physical design 703 in the form of a semiconductor chip or multiple semiconductor chips. In the third embodiment described above, the system tools 702 consists of conventional schematic capture tools, netlist tools, layout tools, fabrication tools, and assembly tools that take the schematic hardware system description 701 and produce a physical design 703 in the form of a printed circuit board populated with semiconductor chips.

Figure 8:
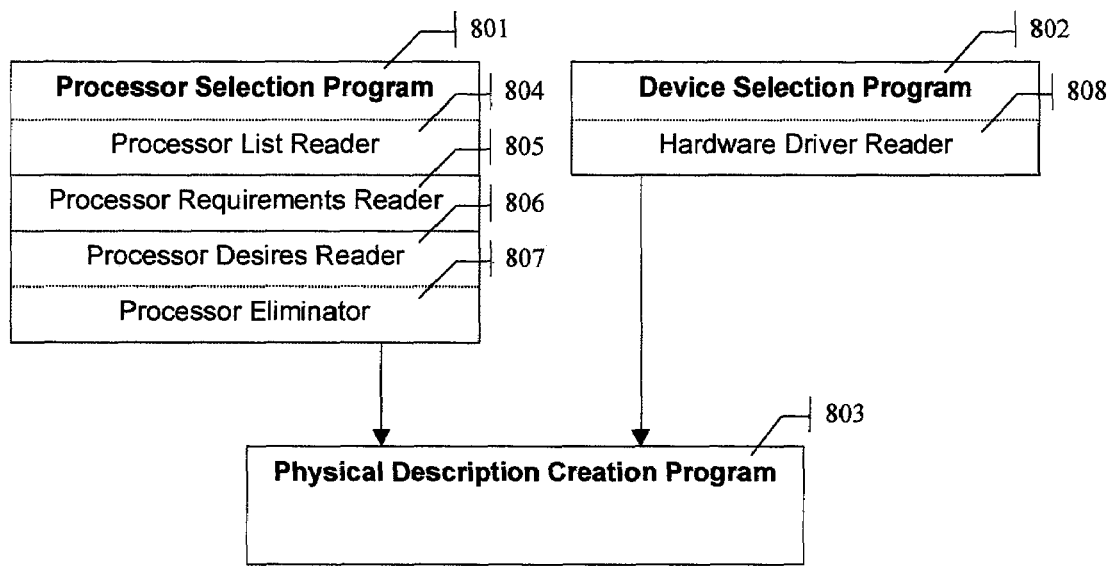
FIG. 8 shows a software architectural diagram of a system synthesis tool.

FIG. 8 shows an architectural diagram of the software of one embodiment of the present invention. Processor selection program 801 consists of a processor list reader routine 804, a processor requirements reader routine 805, a processor desires reader routine 806, and a processor eliminator routine 807. The processor list reader routine 804 reads a list of processors and their attributes from a processor attribute table. The processor requirements reader routine 805 reads processor requirements from a list of processor requirements. The processor desires reader routine 806 reads processor desires from a list of processor desires. The processor eliminator routine 807 eliminates those processors that do not meet the requirements. This routine optionally gives the user an error message if all processors have been eliminated. This routine ranks all processors that have not been eliminated, based on how well they match the list of desired attributes. The user can then select a processor and the processor selection program 801 produces a physical description of the processor. The physical description may be an HDL description, a schematic, a netlist, or another description that can be easily turned into a physical processor.

The software architecture also includes a device selection program 802. This program includes a hardware driver reader routine 808 that reads hardware driver source code files and determines the corresponding physical description for the hardware device from information in the driver source code. The physical description may be an HDL description, a schematic, a netlist, or another description that can be turned into a physical hardware device.

The software architecture also includes a physical description creation routine 803 that combines the processor physical description with the hardware device physical description to create a physical description of the entire system.

Figure 9:
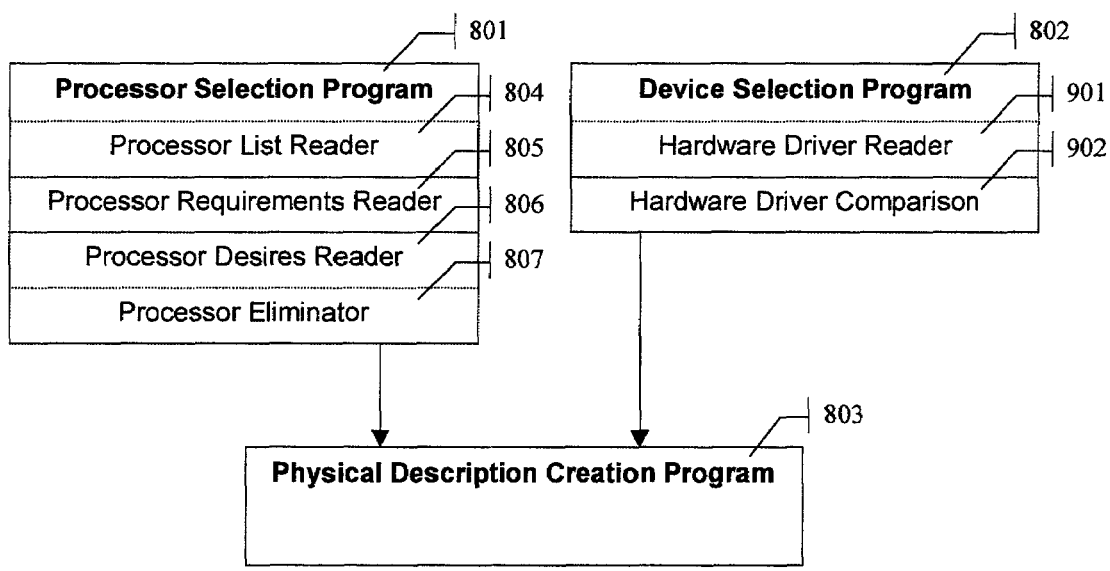
FIG. 9 shows a second software architectural diagram of a system synthesis tool.

FIG. 9 shows an architectural diagram of the software of another embodiment of the present invention. In this embodiment, the device selection program 802 consists of a hardware driver reader routine 901 and a hardware driver comparison routine 902. The hardware driver reader routine 901 reads source code of hardware device driver software routines. The hardware driver comparison routine 902 compares the source code of the hardware driver software routines to source code of known hardware driver software routines to determine the corresponding physical description for the hardware device.

Various modifications and adaptations of the operations described here would be apparent to those skilled in the art based on the above disclosure. Many variations and modifications within the scope of the invention are therefore possible. The present invention is set forth by the following claims.

We claim:

1. A computer-implemented method of selecting a hardware device for a hardware driver software source code routine in a set of software source code files, said method comprising:
   searching for a hardware driver software source code routine in said set of software source code files using a processor implementing a system synthesis tool;

finding a hardware driver software source code routine;

comparing said found hardware driver software source code routine with entries in a set of hardware driver software source code routines and corresponding hardware devices to identify a hardware driver software source code routine in said set of hardware driver software source code routines based on said found hardware driver software source code routine; and selecting from a set of hardware representations a hardware representation of the hardware device corresponding to said identified hardware driver software source code routine using the processor implementing the system synthesis tool.

2. The method of claim 1 wherein said selected hardware representation comprises a hardware description (HDL) language description.

3. The method of claim 1 wherein said selected hardware representation comprises a physical layout.

4. The method of claim 1 wherein said selected hardware representation comprises a circuit schematic.

5. The method of claim 1 wherein said selected hardware representation comprises a circuit netlist.

6. An apparatus for selecting a hardware device for a hardware driver software source code routine in a set of software source code files, comprising a computer;

a hardware device determination program adapted for running on said computer, wherein said hardware device determination program comprises:

a) means for searching for a hardware driver software source code routine in said set of software source code files;

b) means for finding a hardware driver software source code routine;

c) means for comparing said found hardware driver software source code routine with entries in a set of hardware driver software source code routines and corresponding hardware devices to identify a hardware driver software source code routine in said set of hardware driver software source code routines based on said found hardware driver software source code routine; and d) means for selecting from a set of hardware representations a hardware representation of the hardware device corresponding to said identified hardware driver software source code routine.

7. The apparatus of claim 6 wherein said selected hardware representation comprises a hardware description language (HDL) description.

8. The apparatus of claim 6 wherein said selected hardware representation comprises a physical layout.

9. The apparatus of claim 6 wherein said selected hardware representation comprises a circuit schematic.

10. The apparatus of claim 6 wherein said selected hardware representation comprises a circuit netlist.

* * * * *